United States Patent
Shi et al.

(10) Patent No.: US 6,413,387 B1
(45) Date of Patent: Jul. 2, 2002

(54) CATHODE ARC SOURCE FOR METALLIC AND DIELECTRIC COATINGS

(75) Inventors: Xu Shi; Beng Kang Tay, both of Singapore (SG); Hong Siang Tan, Selangor (MY)

(73) Assignee: Filplas Vacuum Technology PTE Ltd., Singapore (SG)

( * ) Notice: Subject to any disclaimer, the term of this patent is extended or adjusted under 35 U.S.C. 154(b) by 0 days.

(21) Appl. No.: 09/529,966

(22) PCT Filed: Oct. 26, 1998

(86) PCT No.: PCT/IB98/01762

§ 371 (c)(1),
(2), (4) Date: Oct. 12, 2000

(87) PCT Pub. No.: WO99/22395

PCT Pub. Date: May 6, 1999

(30) Foreign Application Priority Data

Oct. 24, 1997 (GB) .............................................. 9722649

(51) Int. Cl.[7] .............................. C25B 9/00; C23C 14/34
(52) U.S. Cl. ................................ 204/192.38; 204/298.41
(58) Field of Search ........................ 204/192.38, 298.41

(56) References Cited

U.S. PATENT DOCUMENTS 4,839,011 A   6/1989   Ramalingam et al. .  204/192.38
5,282,944 A   2/1994   Sanders et al. ........ 204/192.38

FOREIGN PATENT DOCUMENTS

| DE | 3 023 672 A1 | 1/1982 | ............ H05H/1/40 |
| EP | 0 495 447 A1 | 7/1992 | ............ C23L/14/32 |
| EP | 0 511 153 A1 | 10/1992 | ............ H01J/37/32 |
| EP | 0 789 506 A1 | 8/1997 | ............ H05H/1/46 |

OTHER PUBLICATIONS

International Search Report for PCT Appl. No. PCT/IB 98/01762, 5 pages.

Primary Examiner—Steven H. VerSteeg
(74) Attorney, Agent, or Firm—Sterne, Kessler, Goldstein & Fox, P.L.L.C.

(57) ABSTRACT

A cathode arc source generates positive ions from a non-graphite target. The cathode arc source includes (a) a cathode station to receive the target; (b) a first magnet to generate a first magnetic field at the target; and (c) a second magnet to generate a second magnetic field at the target. The second magnetic field has a direction opposite to that of the first magnetic field so that the resultant magnetic field has a point of zero field strength above the target. In an embodiment, the first magnet is located below the target and includes a coil with a diameter greater than the diameter of the target. The second magnet is located above the target.

17 Claims, 6 Drawing Sheets

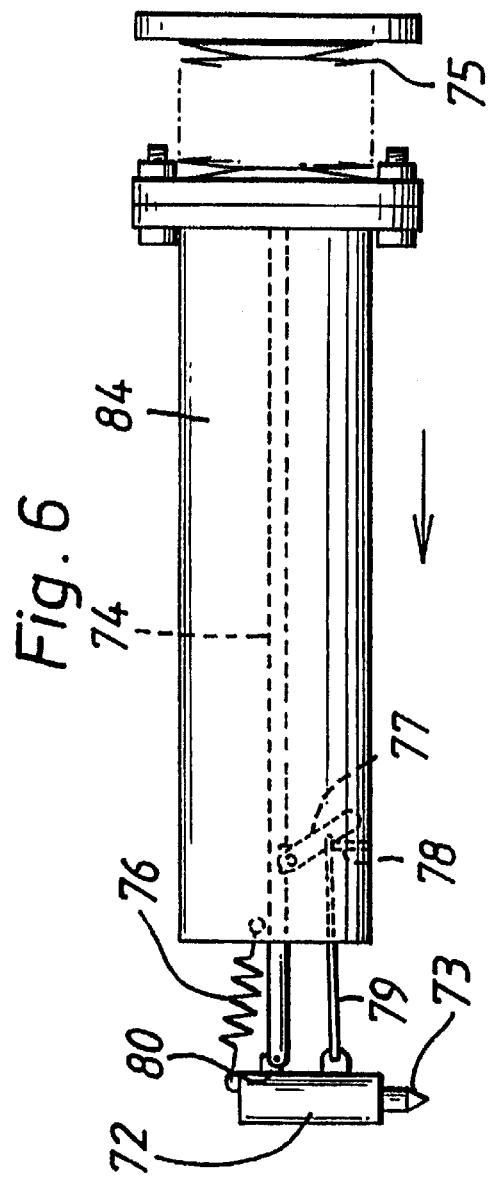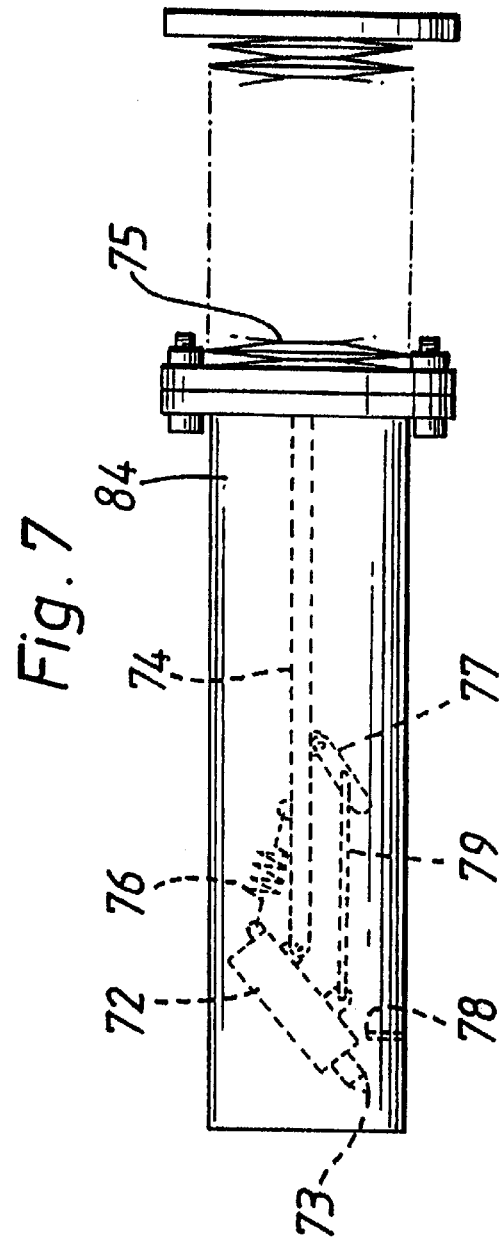

CATHODE ARC SOURCE FOR METALLIC AND DIELECTRIC COATINGS

The present invention relates to a cathode arc source, in particular a filtered cathode arc source for metallic and dielectric coatings, to an anode liner for a cathode arc source, to a method of operation of a cathode arc source and to a striker for a cathode arc source.

The source of the invention is suitable for use with or without filtering apparatus, though it is conveniently used with a double bend filter duct as previously developed and described in WO-A-96/26531 by the same applicant.

Filtered cathode arc sources are known for producing thin metallic and dielectric films on a variety of substrates. An acknowledged problem in prior art sources is that the intense arc spots of the sources produce large quantities of macroparticles that contaminate the deposited films. The problem of reducing the number of macroparticles in the films is conventionally addressed by provision of means for filtering macroparticles from the beam of positive ions emitted from the cathode target of the source.

Known commercial apparatus, described in U.S. Pat. No. 5,433,836, incorporates a 45° angle bend to filter macroparticles from the beam. Apparatus described by the present inventors in WO-A-96/26531 describes a double bend filter duct for the same purpose. While the quality of tetrahedral amorphous carbon films obtained using the latter apparatus is high, the search for improvements in the quality of metal and dielectric films continues.

It has also been observed that in use of known apparatus, the surface of the target is consumed in an uneven manner, as the arc spot moves erratically about the surface of the target. This movement of the arc on the surface of the target is uncontrollable and deposition rate falls when the spot approaches the edge of the target. Targets have to be replaced well before all the target material is consumed, which is inefficient.

In theory, multi-layer coatings produced using a sequence of metal targets would produce highly desirable properties in the composite film obtained. However, known apparatus does not permit commercial manufacture of these coatings as interchange of targets is awkward. In addition, existing apparatus are not suitable for long term, industrial use, being designed only for laboratory use. Thus, to realise the theoretical properties of multi-layer coatings an improved apparatus is needed.

To ignite an arc in known apparatus requires a striker, conventionally moveable and located at or very close to the cathode target. A disadvantage of this arrangement is that in use of the arc source the striker often interferes with the arc: by interfering with the electric field at or around the target, by physically preventing cooling of an area of the vacuum chamber wall or by introducing contaminants into the plasma. An alternative striker mechanism would be desirable.

The present invention seeks to provide a new design of cathode and anode, a new striker mechanism and new operational methods and other features that, separately or in combination, eliminate or at least ameliorate some of the problems identified in the prior art.

It is thus an object of the invention to provide method and apparatus to generate an arc from a cathode target which in use emits fewer macroparticles compared to the prior art. A further object is to provide method and apparatus for producing multi layer coatings on a substrate. A still further object is to provide method and apparatus for coating of a substrate, simultaneously from more than one target. A still further object is to provide apparatus for use in combination with a known vacuum chamber that adapts that vacuum chamber for use as a cathode arc source of positive ions. Another object is to provide a cathode arc source capable of long term operation. A yet further object is to provide improved arc striking in the source.

According to a first aspect of the invention there is provided a cathode arc source comprising a cathode station to receive a target and means for generating a magnetic field radially parallel to the target which has near zero normal field strength.

The field is suitably the resultant of fields above and below the target such that there is a significant lateral component to the field at or just above the target surface. This lateral (or radial) field is for maintaining the arc spot on the target surface and it has advantageously been found that target utilisation is improved, for example is more even, and that the arc is more stably maintained when operating a source having such a lateral field.

A field generating means may be located at or below the cathode station so that the target when at its station is a short distance above the top of the first generating means, suitably at least 2 mm. The magnetic field at the target surface thus has two components, and preferably both can be adjusted. One component is substantially perpendicular (normal) to the target while the other is substantially in the lateral (radial) direction. The lateral field helps to steer the arc spot, to ensure high target utilization, and keep the normal field strength low. The combination promotes stable arc operation.

The source is for generating a metallic and/or dielectric coating and therefore comprises a target made of a material other than graphite. Suitable target materials include solid metals and semiconductors, but exclude carbon. Examples of suitable target materials include gold, platinum, silver, titanium, lead, copper, tungsten, molybdenum, silicon, aluminum, gallium, germanium. Coatings deposited using the arc source of the invention optionally contain gas such as oxygen or nitrogen in combination with one or more target materials. The cathode arc source of the invention is thus suitable for incorporation into apparatus for deposition of metal, oxide, nitride and ceramic coatings.

In an embodiment of the invention, a cathode arc source for generating positive ions from a cathode target, said ions being emitted in a direction normal to a front surface of the cathode target, comprises a vacuum chamber and means for generating a magnetic field in the vacuum chamber, wherein the magnetic field has direction normal to the front surface of the target and zero field strength at a position above the target. The cathode arc source preferably comprises means for generating a first magnetic field proximal to and below the target and having a first field direction and means for generating a second magnetic field distal to and above the target and having a field direction opposite to that of the first. The resultant magnetic field inside the vacuum chamber includes a point above the target at which the field strength is zero in a direction normal to the front surface of the cathode target, and at the same time a field is provided on the target surface with a strong radial component. This radial field preferably has strength of at least 5 Gauss, typically not more than 40 Gauss and more preferably 15–25 Gauss. In scaled-up apparatus, though, the radial field strength may have to be altered.

In use, the cathode arc source of the invention produces a plasma beam of positive ions and electrons having reduced numbers of macroparticles. The invention thus addresses the problem of how to remove macroparticles from plasma by control of a magnetic field within the vacuum chamber of the source so that fewer macroparticles are generated ab initio. Filtering of the plasma beam further to reduce macroparticles is an option and is a feature of preferred embodiments of the invention.

In a particular embodiment of the invention, a cathode arc source for generating positive ions from a cathode target comprises means for generating a magnetic field wherein:

(1) at a front surface of the target, field direction normal to the front surface is towards the front surface;

(2) magnetic field strength normal to the front surface decreases with increasing distance from the target to a point of zero field strength normal to the front surface; and (3) from the point of zero normal field strength, with increasing distance from the target, field direction is away from the front surface of the target.

Alternatively, the field directions in (1) and (2) can be reversed, so long as there is, above the target, a point or region of zero field strength normal to the target surface. Hereafter, a point of zero field strength in a direction normal to, or radially parallel to, the front surface of the target is also referred to as a null point.

In a specific embodiment of the invention described in detail below, a cathode arc source comprises first magnetic field generating means for generating a magnetic field between the target and the substrate and having field direction towards the substrate, and second magnetic field generating means for generating a magnetic field between the target and the substrate with field direction towards the target. The second magnetic field generating means is located adjacent a rear surface of the cathode target.

In another particular embodiment of the invention, there is also provided means for varying the strengths of the one or both of the respective magnetic fields so as to vary the position of zero normal field strength above the target. During deposition of dielectric or other coatings that include oxygen an oxide layer rapidly builds up and contaminates the anode in prior art apparatus. Oscillation of the null point position according to the invention reduces this problem. In addition, as the anode in apparatus of the invention is typically an inner wall of the vacuum chamber (including any liner that may be present) having already a large surface area, especially when compared with specific anodes in prior art apparatus, oscillation of the null point position further increases the available anode surface area allowing increased operating time before the anode is so contaminated that the arc must be shut down. In tests, we have increased operating times five-fold using this method.

The cathode arc source of a preferred embodiment comprises two magnetic field generating coils. The first coil is located above the target, and in use is between the target and the substrate. Such a magnetic field coil is conventionally found in filtered cathode arc sources as it provides a magnetic field to steer plasma produced from the target through filtering apparatus, that may for example comprise a single or a double bend and other filtering structures such as baffles, and towards the substrate. The field generated by the coil, normal to the cathode target, has its direction away from the target and towards the substrate. This cathode arc source also comprises a second magnetic field coil located below the target, that is to say the other side of the target from the substrate. This second coil generates a magnetic field in the opposite direction from the magnetic field generated by the first coil. The effect is that the field produced by the second coil partially counterbalances the field produced by the first coil such that, by adjustment of the relative field strengths, at a point above the target the normal field has a null point. As mentioned above, field directions are optionally reversed so long as there is a null point in the field above the target.

As the current in the respective coils is changed so the null point, that is to say the point of zero field in the normal direction, moves further away from or further towards the surface of the target.

It has been found that while the respective coil currents are varied so as to move the zero point in the normal field above the cathode target, the lateral field at or just above the target surface is relatively strong but stays within acceptable boundaries—typically between 12 and 35 Gauss for variations in coil current of between 5 A and 20 A for the coil below the cathode while the coil above the cathode is maintained at a steady 10 A—for this lateral field to have a significant effect on arc behaviour and deposition rate.

It has been observed that as the null point approaches close to the target, the arc becomes more intense and is located closer to the target, a strong blue plasma is seen and there is a decrease in the deposition rate.

As the null point moves far away from the target, the strength of the magnetic field at the target surface increases and sustaining the arc and striking the arc become problematic. There is also seen a decrease in deposition rate. Further, it is observed that target material is deposited onto the target and onto the wall of the vacuum chamber.

The null point is therefore chosen so as to be at an intermediate position, producing an arc having a diffuse arc flame and reduced arc spot intensity. In an embodiment of the invention, using a metal target of 60 mm diameter, a current of about 10 A in the coil below the target and about 3 A in the coil above the target, the null point is about 2–3 cm above the front surface of the target, and blue plasma giving a useful deposition rate is obtained. Few "red flies" are observed in this arc, and a plasma beam is produced having a columnar shape. It is also observed that this column of arc tends to remain in the centre of the target and to erode the target evenly. Optimum location of the null point varies according to the choice of target material, though is typically 1–4 cm above the target for metals. Generally, good results are obtained when the current in the coil below the target is higher than that in the coil above the target.

While arc current is flowing, a hump, being an area concentrated in positive ions, forms above the target surface. Most positive ions are accelerated back towards the target surface, which is at a negative potential typically of about −30 volts, impinging upon the target surface with high energy and perpetuating the arc. Current flows as atoms on the surface of the target are disassociated into ions and electrons-which flow to the anode which is grounded and therefore at zero volts. A typical arc current is about 100 A and at this current the plasma current, i.e. the positive ions that form the plasma beam may have a current of about 1 A. Thus, the current that goes to forming the plasma beam of positive ions is a very low proportion of the total arc current.

Arc voltage is generally fixed by the target and is material specific and often around 20–30 volts negative. This is in contrast to the arc current which often has a minimum value required to strike and sustain the arc but can increase giving increased deposition rate. Using titanium, the prior art apparatus typically strikes an arc with a current of 50 A. In the apparatus of the invention at least 100 A is needed to strike and sustain the titanium arc. The null point for titanium is ideally located about 3–4 cm above the target surface, and optimisation of the null point is similar for most metals though the inventors have in practice looked most closely at titanium and aluminium targets. Deposition rate against distance of null point from the target increases up to a distance of about 4–6 cm and then decreases, as the arc begins to fail when the null point is more than 5–6 cm above the target.

The plasma beam produced by this cathode arc source can subsequently be filtered using conventional single or double bend ducts. Magnetic guiding of the plasma beam is achieved because the plasma beam follows the field lines of the magnetic field as is well known in the art.

At the null point, the field strength normal to the target is zero and there is a strong lateral field. The normal field strength is measured in the centre of the plasma beam. The lateral field strength is measured along the cylindrical wall of the anode. In use, the walls of the chamber in which the cathode arc source is located are typically coated with flakes of target material, which glow at the point of strong lateral field where electrons impinge to the anode to form a closed electric circuit, so visual observation of the position of the zero normal field, i.e. the null point, is readily made.

Magnetic guiding or steering of the plasma produced from the cathode arc source may be achieved using permanent magnets. These are typically shaped so as to fit snugly around a plasma duct guiding the plasma from the arc source to a distal substrate. An advantage of using permanent magnets is that the magnetic field around the bend or bends in the plasma duct is substantially even across the whole width of the bend, leaving to increased transmission rate of plasma through the duct and less loss of plasma to the duct wall.

It is a further option to provide a magnetic field at or below the target by use of a permanent magnet, preferably moveable so as to vary the null point location.

In use of the source of the invention, it is observed that the cathode spot produced on the surface of the target is more diffuse than when using prior art sources. It has further also been observed that the cathode target of the invention is consumed uniformly. As arcing is generally regarded as a catastrophic physical event this observation is surprising, as well as pleasing.

For scale-up of the apparatus for use of plasma ducts of large width, say greater than about 10 cm (6 inches), the strength of the guiding field is required to be increased to guide plasma through the bend or bends in the duct. This increased field strength can influence the field around the target, necessitating an increase in the strength of the reversing field below the target—so that a null point above the target and a field on the target surface having a strong radial component are suitably maintained. Large increases in these fields, however, risk making the arc unstable.

A solution offered in the present invention is to provide apparatus having a large plasma duct in which the guiding field is at least partially shrouded or directed by a shroud of material having a high magnetic permeability. Iron is a suitable material, as are the so-called "$\mu$-metals" being typically alloys having high magnetic permeability. These alloys can for example contain Cobalt, Nickel and Iron.

The shroud optionally surrounds the guiding field coils or magnets. It should at least be so placed as to shroud the area immediately above the target from the guiding field.

It is further optional to modify the surface of a metal target before striking an arc using the cathode arc source of the invention. For example, a rim protruding out of the surface is optionally formed in the surface of the metal target. The rim helps prevent the arc migrate to the edge of the target.

A further embodiment of the invention relates to apparatus for coating both sides of a substrate and comprises:

a deposition chamber, said chamber comprising a substrate station on which a substrate may be mounted;

a first cathode arc source for depositing plasma on a front surface of a substrate;

a second cathode arc source for depositing plasma on a rear surface of said substrate;

means for generating a magnetic field radially parallel to a target in the first source which field has near zero normal field strength; and means for generating a magnetic field radially parallel to a target in the second source which field has near zero normal field strength.

In a preferred embodiment of this apparatus, at a front surface of a target in the first source, field direction normal to the front surface of the target in the first source is towards the front surface, field direction in a guiding field is away from the front surface of the target in the first source and is towards a front surface of a target in the second source, and field direction normal to the front surface of the target in the second source is away from the target of the second source, measured at its front surface.

A second aspect of the invention addresses the problem of providing multi layer coatings on substrates, and also addresses the problem of providing a mixed coating on a substrate.

Accordingly, a second aspect of the invention provides a cathode arc source comprising an anode, a cathode station for a first target, and means for generating an arc between the anode and the first target, and further comprises a cathode station for a second target and means for generating an arc between the anode and the second target. The source is adapted so that generation of arcs from the first and second targets can occur independently of each other and can occur simultaneously.

To enable ignition of arcs separately from each of the first and second targets, it is convenient to provide separate arc ignition means for each target. A suitable arc igniter is moveable between an ignition position in which a tip of the igniter is in contact with the target, and a storage position in which the tip is retracted away from the target. It is also contemplated, however, that a single arc igniter is provided, moveable for ignition of arcs from the first and the second targets separately.

The source of the second aspect of the invention is suitable for laying down of multi layer coatings, as a first target of one material and a second target of a different material can be used in sequence to produce a multi-layered coating. Alternatively, should a coating be desired which comprises a mixture of materials, such as an alloy, then arcs from both first and second targets can be operated simultaneously to produce that coating. The apparatus of the invention thus provides a significant advance in multi layer coating technology.

Generally speaking, embodiments and features of the first aspect of the invention are also suitable for use in the second aspect of the invention. Specifically, a cathode arc source of the second aspect of the invention optionally includes means for generating magnetic fields above and below the targets such that a null point, of zero magnetic field in the normal direction, and having a strong lateral field, is located above the targets. As with the first aspect of the invention, filtering of the plasma beam, using single or double bend, or other, ducts is also optional.

The cathode arc source of the second aspect comprises a vacuum chamber and within this chamber the anode and targets are preferably electrically insulated from each other using non conducting shrouds made of a suitable material such as alumina or PTFE. Typically, the first and second targets are located next to one another on a cathode station, and separated by a non-conducting shroud. In an embodiment of the invention the targets are circular and approximately 30 mm in diameter and are separated from each other by a non-conducting shroud at least 5 mm wide at the point of closest approach of the targets to each other.

In further embodiments of the invention, the cathode arc source additionally comprises third and optionally fourth targets, each operable separately or simultaneously with each of the other targets.

In use of a multi-target cathode arc source, the ratio of targets of one material to targets of another material can be chosen so as to effect the stoichiometric ratio of the deposited coating. For example, in a cathode arc source having four targets, three of those targets can be aluminum and one of the targets titanium to produce a coating being a combination of aluminum and titanium.

The arrangement of targets within the vacuum chamber is conveniently chosen according to the number of targets. Generally speaking, the choice of target shape is at the option of the user, and square, rectangular, circular and semi-circular targets are contemplated by the inventors. A source having two targets could have two semi-circular targets separated by a shroud. A source having three targets could have three targets in the shape of even-sized segments of a circle, again separated by shrouds. A source having four targets could have the targets arranged as four square targets making a larger square, again with all targets electrically insulated from each other.

In a specific embodiment of the invention, a cathode arc source comprises first and second targets, located at a cathode station itself located substantially centrally within and inside an anode that is of larger diameter than and surrounds the cathode station. The two targets are circular and 30 mm in diameter and separated from each other by a non-conducting electrically insulating shroud made of alumina or PTFE. The targets are further insulated from the anode by a similar shroud. The cathode station is water cooled so that each of the two targets does not overheat in operation. The anode is water cooled and an arc power supply is provided to the anode and each of the two targets. A separate striker is provided for each of the targets which can be operated simultaneously or one at a time. A magnetic coil is located below the cathode station and generates a magnetic field at the cathode station having direction substantially normal to the surfaces of the targets. A second magnetic field is generated by a second coil located above the target, and wound around an upper portion of the anode. The magnetic field generated from the second coil counterbalances the magnetic field from the first coil such that at the surfaces of the cathode targets there is a strong lateral component to the field and at a point approximately 5–6 cm above the surfaces of the two targets there is a point in which the magnetic field strength in a direction normal to the surfaces of the target is zero. The cathode arc source also comprises a single bend filter duct and the second magnetic coil forms part of the magnetic guiding field for guiding the plasma beam around the single bend filter duct and towards a substrate, mounted distally away from the targets.

A third aspect of the invention is related to striking of an arc in a cathode arc source and addresses the problem that known strikers interfere with the operation of the arc source.

Accordingly, a third aspect of the invention provides means for ignition of an arc at a cathode target of a cathode arc source, comprising:

a striker, movably mounted on a striker arm, the striker comprising a body on which is mounted a tip in electrical connection with a switchable ground for arc ignition, wherein the arm is adapted for movement of the striker between a first position, retracted away from the target, and a second position, proximal to the target, and wherein the striker is adapted for movement relative to the arm, once the striker is in the second position, to move the tip of the striker downwardly towards the target.

This ignition means is of advantage in use because once the arc has been ignited, the striker can then be fully retracted away from the target. To ignite the target, the tip of the striker needs to project so as to approach close to the target surface. Once the arc has been ignited, it is awkward to store prior art strikers without obstruction of either the electric field around the vacuum chamber or the supply of cooling water to the inner surface of the vacuum chamber, or both. The striker of the invention is moveable with respect to the arm so that the tip can project in order to ignite the arc and can then be moved towards a position in which it is more in line with the arm, and subsequently the arm can be fully retracted far away from the target and interfere only minimally with the electric field and the cooling of the vacuum chamber.

In an embodiment of the invention described in detail below, the ignition means is adapted so that initial movement of the arm moves the striker towards the target without movement of the striker relative to the arm, and subsequent movement of the arm induces movement of the head relative to the arm so as to approach the tip of the striker head downwardly towards the target surface.

It is preferred that the striker is pivotally mounted on the arm and is pivotable between a position in which the tip projects outwardly and downwardly and a position in which the tip is retracted towards a position flush with the striker arm. The striker arm can then be retracted into a relatively small sized recess in the wall of the vacuum chamber and, consequently, there is reduced disruption in supply of cooling water and electric field to that area of the vacuum chamber into which the ignition means is retracted when not in use.

In an embodiment of the invention, the striker comprises an actuator, linking the striker arm to a portion of the striker, that in use abuts a cam surface on the floor or wall of the vacuum chamber such that movement of the arm induces, via action of the actuator on the cam surface, movement of the striker relative to the arm.

The tip of the striker is in electrical connection to means for igniting the arc, and typically is connected to a switchable ground. The electrical connection is achieved in an embodiment of the invention by use of a vacuum bellows surrounding the striker arm and an electric feedthrough linking the tip of a striker to a power supply outside the vacuum chamber. A rotary feedthrough may also be used for the electrical connection. In a specific embodiment of the invention described in detail below, the striker arm is substantially straight and provides lateral movement of the striker away from and towards the target, and the striker can pivot on the arm downwardly towards the target. The striker thus has essentially a linear retraction movement, and has minimal intrusion into the anode and therefore minimal disturbance in the electric field. Typically, the striker is located in the wall of the vacuum chamber and below the null point in the magnetic field when the arc is in use.

Filtered cathode arc sources are known in the art as single pieces of equipment but are expensive and rare laboratory items. A fourth aspect of the invention relates to adapting a known vacuum chamber for use as a cathode arc source.

Accordingly, a fourth aspect of the invention provides a plasma gun for use in a vacuum chamber to generate positive ions from a cathode arc, comprising:

a cathode and an anode,
the cathode being located inside and surrounded by the anode, and the cathode being electrically insulated from the anode by a non-conducting shroud,
means for connecting the anode and the cathode to an arc power supply
means for connecting the anode and the cathode to a supply of cooling water,
and means for generating a magnetic field in the vacuum chamber having field direction normal to the cathode and zero strength in this normal direction at a position inside the vacuum chamber and above the cathode.

The plasma gun is of advantageous use in that it is suitable for installation into a known vacuum chamber so as to convert the known vacuum chamber into a cathode arc source. Vacuum chambers are common pieces of laboratory equipment, whereas generally speaking cathode arc sources are rare in the laboratory. The invention thus enables additional use to be made of these existing vacuum chambers.

Filtering of the plasma beam generated from the source is further an option, though in cases where the quality of the plasma beam produced from the source is acceptable without further filtering little further adaptation of the vacuum chamber would be required in order to make it suitable for conversion into a cathode arc source using the plasma gun of the invention.

The features and embodiments of the first aspect of the invention are also suitable for use in an plasma gun of the fourth aspect of the invention, though whereas in the first aspect of the invention an embodiment comprises an anode which is the chamber wall, or a portion of a chamber wall, the fourth aspect of the invention provides an ion gun comprising its own anode, and this plasma gun is to be placed within a vacuum chamber having a separate chamber wall which does not function as an anode.

In an embodiment of the invention, the ion gun comprises a first magnetic coil wound around the cathode and located below the target and for generating a magnetic field having field direction normal to the target and towards the target, and further comprises a second magnetic coil wound around the anode and located above the target and for generating a magnetic field having direction normal to the target and away from the target, and wherein the resultant of these two magnetic fields provides a point in the magnetic field in which in a field direction normal to the target the field has zero strength.

In a preferred embodiment of the invention, the anode is substantially cylindrical and surrounds the cathode which is located substantially centrally within the anode, and wherein the second magnetic coil is wound around an upper portion of the cylindrical anode.

The plasma gun of the fourth aspect of the invention is also suitable for use in combination with means for injecting gas into the vacuum chamber for manufacture of reactive coatings.

The invention also relates to industrial use of a cathode arc source. Accordingly, a fifth aspect of the invention provides a liner for an anode in a cathode arc source, composed of two or more pieces that interlock to form a liner that fits tightly inside the source and against an outer surface of the anode and which pieces can be separated for removal from the source.

The pieces forming the liner can be substantially symmetrical with each other, and these are typically 2, 3 or 4. Alternatively, the pieces can be of different sizes. Connections between the pieces are optionally by interference fit of respective projections and recesses on alternate pieces. Connections between the pieces can also be by way of overlapping protrusions adapted for attachment to an outer surface of the anode or of the source with a screw or bolt or nut or similar. The pieces are adapted when assembled to contact the anode tightly to ensure good electrical contact with the anode as the arc current will be conducted through the liner.

The material of the liner is chosen from metals, alloys and other heat resistant materials. Stainless steel, nickel and molybdenum are suitable as are all materials from which inner walls of the cathode arc source are known to be made. In a specific embodiment of the invention described in an example below, the liner comprises or is made of graphite—graphite being capable of withstanding extremely high temperature and having the further advantage that when oxygen-containing coatings are being deposited combination of the liner with oxygen in the chamber results in formation of CO or $CO_2$ gas rather than an oxide coating which might accumulate on the anode and affect performance of the arc source. Use of an anode liner facilitates use of anode materials that have lower melting points—as they do not have to withstand such high temperatures over a small area as without the liner. Consequently, whereas steel has routinely been used for the anode of arc sources, it is now possible in some instances and with adequate cooling to use other materials such as copper or aluminium.

In a sixth aspect of the invention, there is provided a method of depositing ions on a substrate using a cathode arc source comprising:

(i) forming an arc between a target and an anode of the source using arc current sufficient to sustain the arc;
(ii) providing a magnetic field normal to the target which has a position of zero field strength; and
(ii) varying the position of zero field strength whilst sustaining the arc.

The method typically comprises providing a steering field above the target and a reversing field at or below the target and varying the strength or position of at least one of these fields, resulting in variation of the position of zero field strength. Oscillating the position of zero field strength, within a range of positions suitable for sustaining the arc is one way of carrying out the invention, and this oscillation can be periodic in that it comprises regular upwards and downwards movement about an average position.

By use of this aspect of the invention the service interval of the source can be increased. Wear on the inner surface of the anode—or of the liner if one is fitted-occurs most at the point of greatest current flow, typically at and around the null point in the normal field and the point of greatest lateral field. By varying the location of the null point, even slightly, the wear is spread over a wider area than previously. When laying down some coatings there is build up of deposit on the anode. In time this will adversely affect arc performance, so varying the null point to spread the deposit extends the period for which the source may be in use before servicing is needed.

The location of the null point may be varied by varying the strength of the reversing field or of the steering field, or both. Alternatively, if a permanent magnet is used to generate one or both of the reversing and steering fields, then the magnet can physically be moved to vary the null point height above the target. The degree of variation can be chosen to suit the needs of the user, though in general the null point should not be moved below a point at which the arc can not be sustained or raised above a point at which the arc can not be sustained or arc behaviour becomes erratic.

The sixth aspect of the invention is suitable for use in combination with the first aspect of the invention. Further, a particularly preferred embodiment of the invention incorporates two or more of all six aspects of the invention as described herein.

The invention is now illustrated in the following specific examples illustrated by drawings in which:

FIGS. 6 & 7 show schematic cross-sections of a striker of the invention in different positions.

Figure 1:
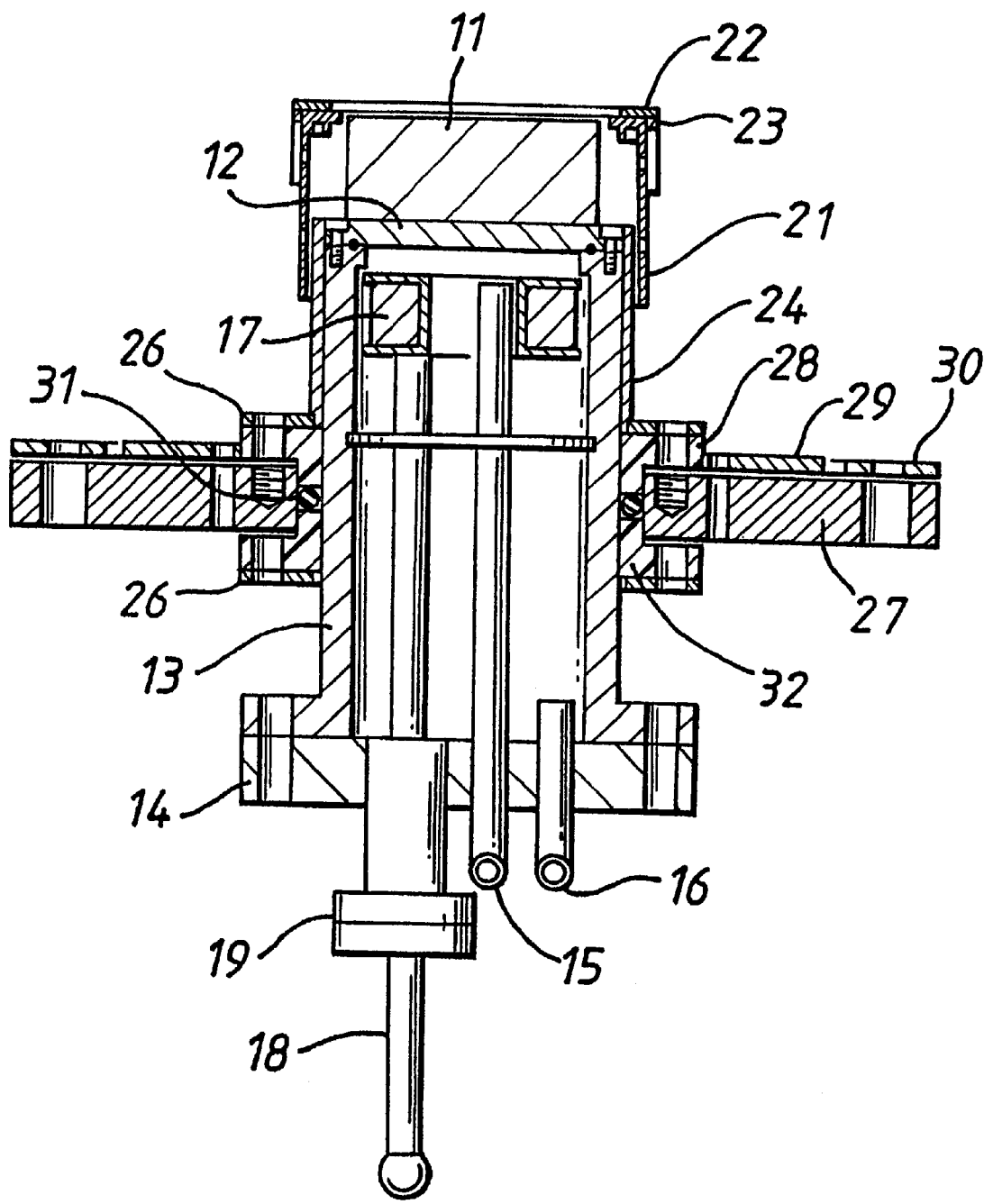
FIG. 1 shows a schematic cross-section of a cathode arc source of the invention.
Figure 2:
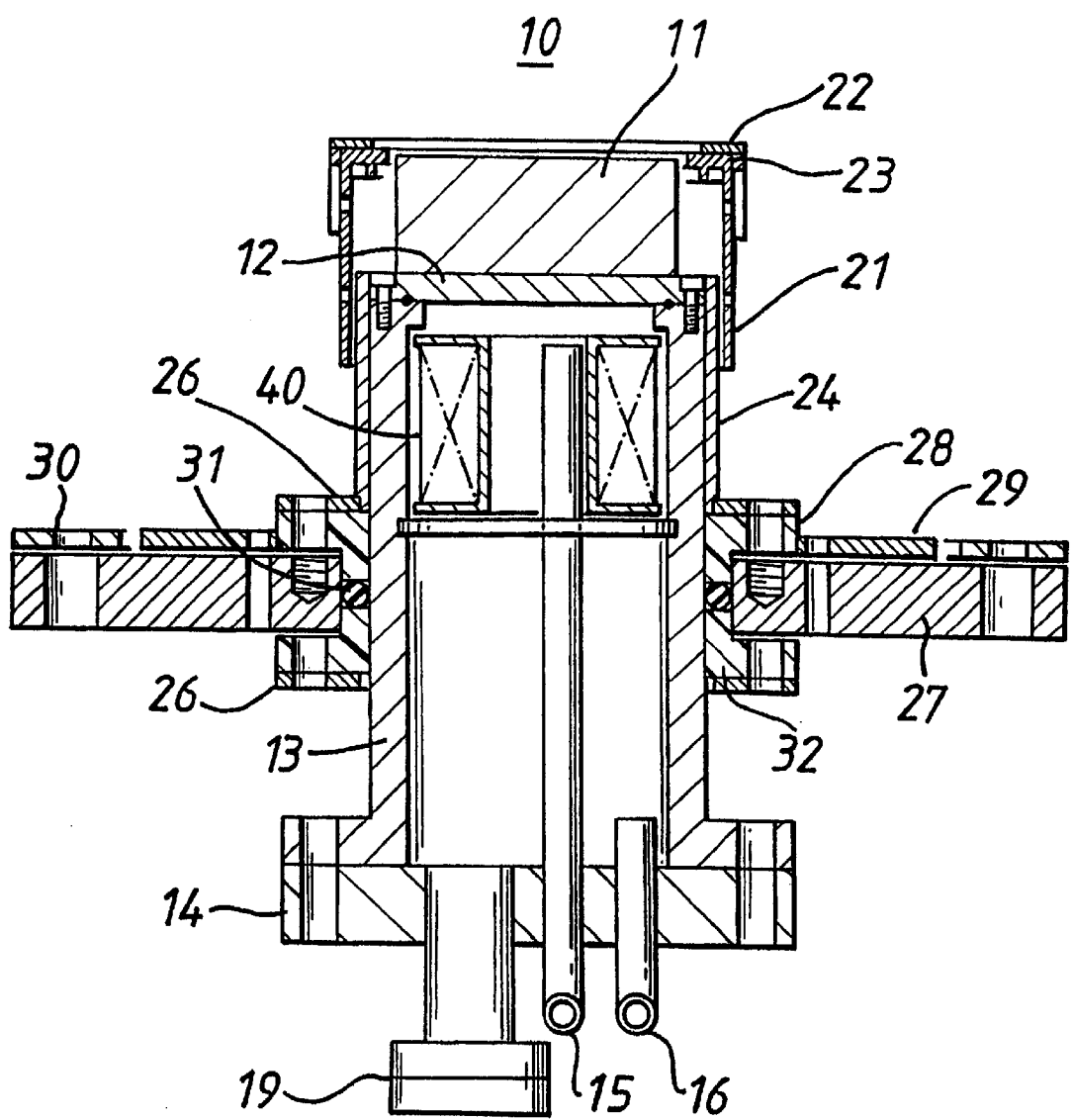
FIG. 2 shows a schematic cross-section of another cathode arc source of the invention.

Referring to FIGS. 1 and 2, a cathode arc source 10 comprises a target 11, in electrical contact with a target plate 12 and a cathode body 13, itself connected to a cathode bottom 14. The combination of a target plate 12 and a cathode body 13 are also referred to as a cathode station—ie for location of a cathode target thereon.

In use, cooling of the target is achieved via flow of cooling water into the inlet 15 and exiting via the outlet 16.

The so-called "reversing field" is provided by permanent magnet 17 mounted on liner motion feedthrough 18 and flange 19. In the source shown in FIG. 2, the permanent magnet 17 is replaced by an alternative electromagnet 40, in which case wires (not shown) supplying power to the electromagnet 40 exit through the flange 19.

Around the target 11 is provided a shield composed of a shield body 21, a ceramic circle 23 and shield cap 22. Other components of the cathode arc source are teflon insulator 24 and means for mounting and location within a cathode arc source made up of steel washer 26, flange 27, teflon seal 28, centring ring 29, spacer ring 30, rubber O-ring 31 and teflon seal 32.

Permanent magnet 17 is mounted for movement upwards and downwards, and can be moved so as to vary the location of the null point in the magnetic field resultant from the "reversing field" and the field for steering plasma (not shown) through a single bend or double bend or other filter apparatus.

Figure 3:
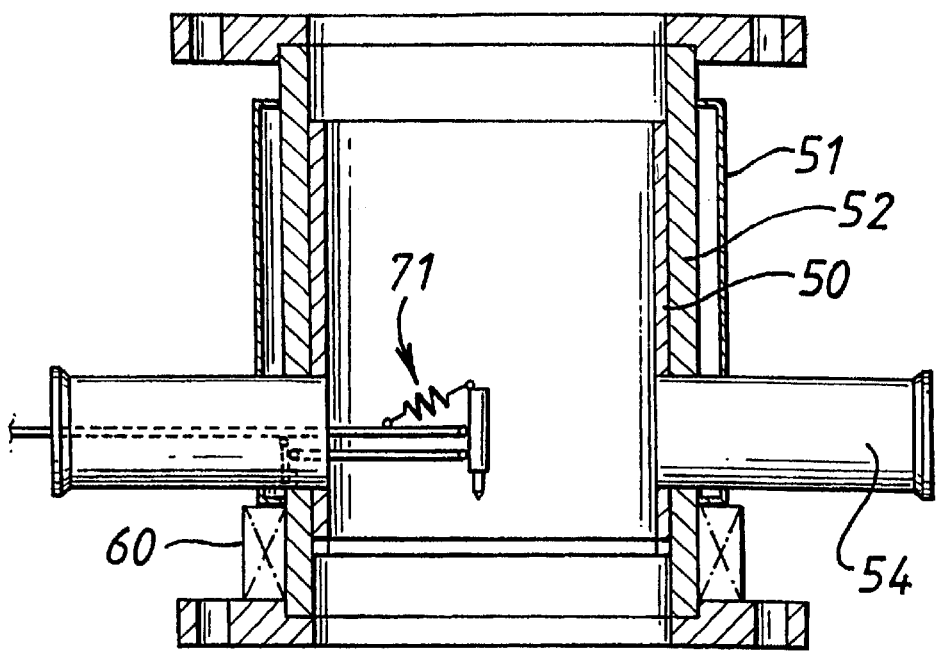
FIG. 3 shows a schematic cross-section of a portion of a cathode arc source including a striker and an anode liner of the invention.
Figure 4:
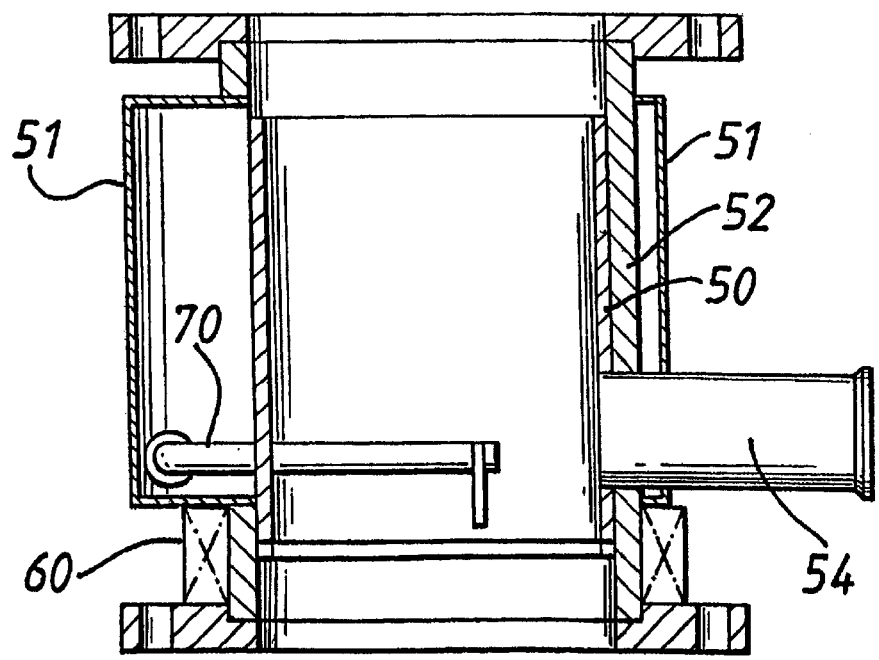
FIG. 4 shows a schematic cross-section of a portion of a cathode arc source including an anode liner according to the invention.

Referring to FIGS. 3 and 4, an anode liner 50 is shown fitted tightly inside and in electrical contact with anode wall 52. Cooling is provided by flow of water through the cooling water housing 51 and observation of the arc is through view port 54. The target is not shown in these two figures though coil 60 for generating the "reversing field" is shown and is below or at about the level of the target when in place. FIG. 3 shows a linear striker 71 and FIG. 4 shows a rotary striker 70.

The anode liner 50 is made of graphite and is in the form of two interconnecting halves which when connected fit snugly inside and against the anode wall 52. The halves can be separated for ease of removal from the anode liner, permitting rapid replacement of the liner, when worn or when contaminated, by a fresh liner.

Figure 5:
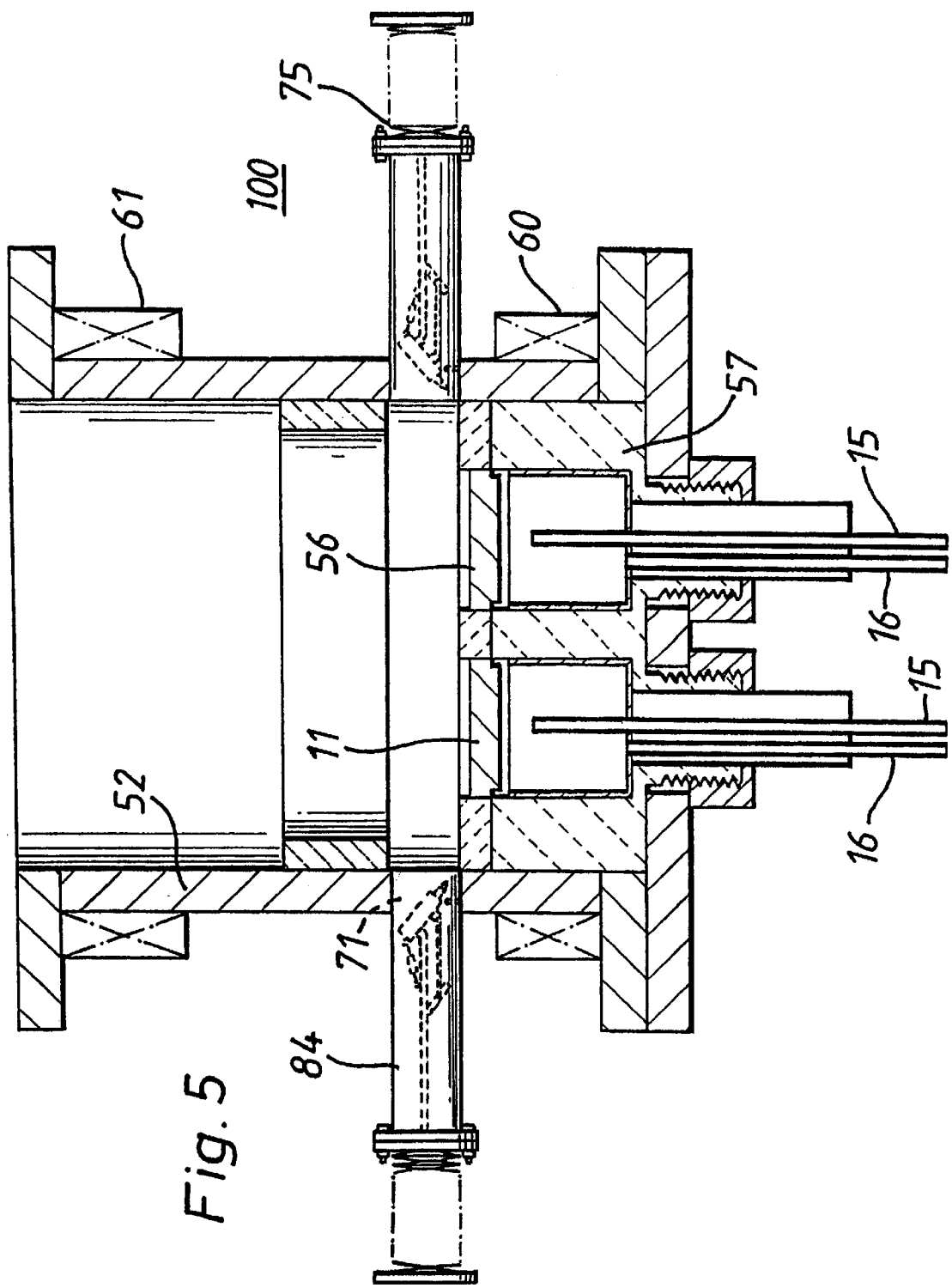
FIG. 5 shows a schematic cross-section of a cathode arc source of the invention.

Referring to FIG. 5 of the drawings, a cathode arc source of the invention 100 is shown having first target 11 and second target 56. Both are cooled by water flowing through inlet 15 and outlet 16 in the usual manner. Targets are located within insulating shroud 57 and are connected to an arc power supply (not shown). Coils for electromagnet 60 and electromagnet 61 provide, respectively, the "reversing field" below the targets and the field for steering plasma from the arc source towards the substrate, optionally via a single or double bend or other filtering apparatus (not shown). Linear striker 71 is mounted at the side of the cathode arc source, and in this particular source there are two such linear strikers. Referring also to FIGS. 6 and 7, the striker has a body 72 and a tip 73 in electrical connection with the power supply for striking an arc at target 11 or 56.

The body 72 is mounted on arm 74 which projects into vacuum bellows 75 so that the striker can be used by an operator outside the vacuum chamber of the source. In operation, the striker is initially retracted inside recess 84 in the position shown in FIG. 7. When it is desired to strike an arc at one of the targets, the arm 74, by action of an operator on the vacuum bellows 75, advances the linear striker towards the target. On the arm 74 there is pivotally mounted an actuator 77 pivotally connected via connector 79 to the body 72 of the striker. Spring 76 holds the body and tip of the striker in the position shown in FIG. 7. When actuator 77 abuts projection 78, further advancement of the arm 74 pivots the striker about pivot 80, moving the tip 73 downwardly towards the target so that arc striking can occur. After striking of the arc, retraction of the arm 74 and contraction of spring 76 pulls the striker back into the position shown in FIG. 7 and the striker can then be retracted into recess 84 out of the way of the arc and so as not to interfere with or contaminate plasma from the arc.

Figure 8:
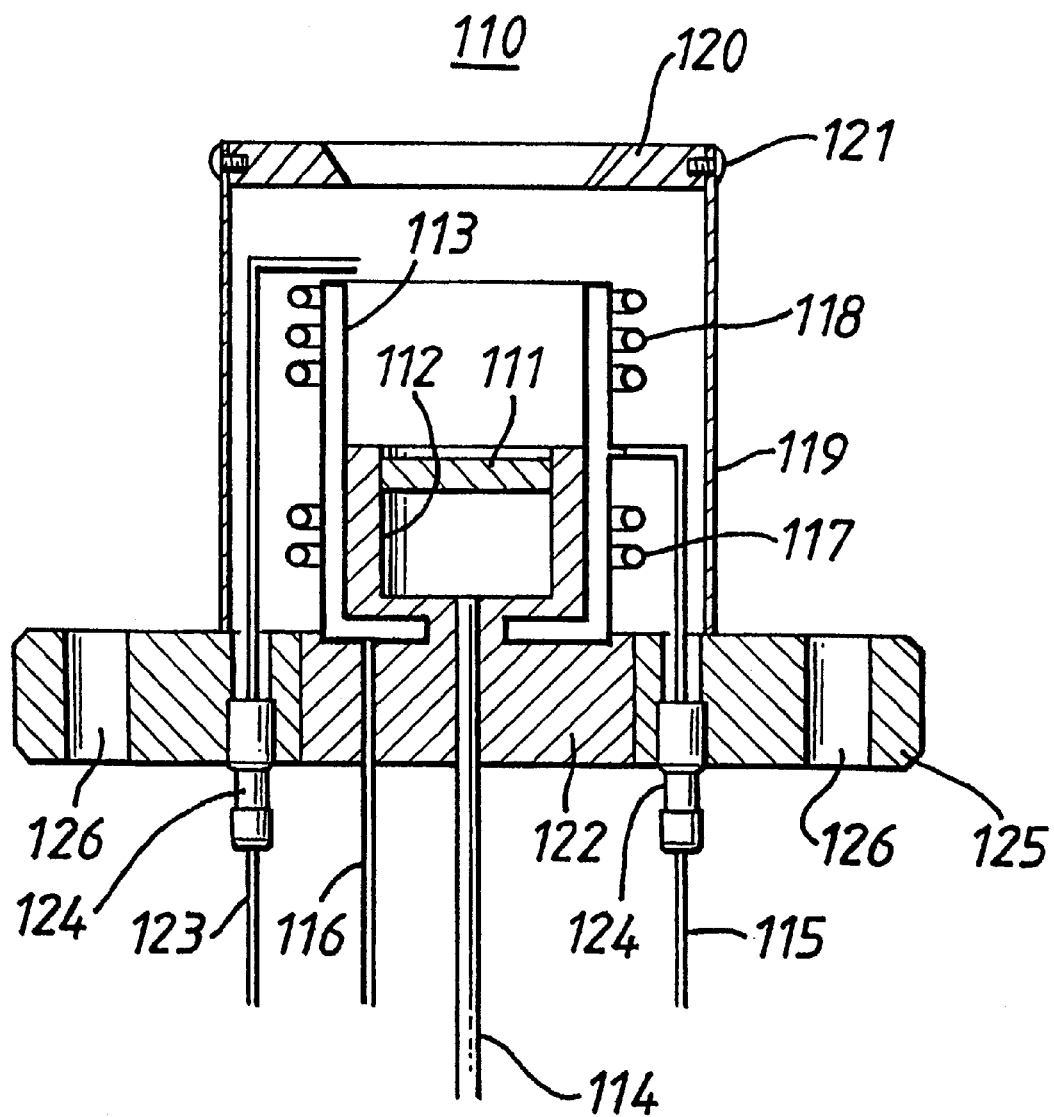
FIG. 8 shows a schematic cross-section of a plasma gun of the invention.

Referring to FIG. 8, a plasma gun 110 comprises target 111 in electrical connection with cathode 112, cooled by flow of water through inlet 114 and an outlet (not shown). Anode surface 113 is in electrical connection to a power supply via either cooling water inlet 115 or outlet 116. Coils or permanent magnets 17 are located below the target to provide a reversing field and similar coils or magnets 118 above the target provide a guiding field. A protective structure such as collar 119 is located around the source, preventing damage e.g. whilst installing the plasma gun into a vacuum chamber. A metal or ceramic shield 120 is mounted on top of the collar, held to the collar by screw 121. The shield can also act as support structure for a grid to be mounted on the plasma gun so it also functions as an ion gun.

Ceramic insulator 122 separates the anode from the cathode, and a fixed arc trigger (not shown) is located within the gun for arc striking. Gas may be introduced into plasma emitted from the plasma gun by gas inlet 123. Conventional vacuum seals 124 are used for feethroughs of water, gas and power conduits (not all seals are shown).

The gun is mounted on flange 125 with locating holes 126 for installation into a vacuum chamber. In use, the gun is connected to conventional power, water and gas supplies or lines, converting a vacuum chamber into a cathode arc source.

The invention enables production of thin films, and multi layer thin films, containing fewer macroparticles, and enables long term and industrial use of a cathode arc source in deposition apparatus.

What is claimed is:

1. A cathode arc source for generating positive ions from a non-graphite target, comprising (a) a cathode station to receive the target, (b) first means for generating a first magnetic field having a first direction, and (c) second means for generating a second magnetic field having a direction opposite to that of the first, wherein said first means comprise a coil having a diameter greater than a diameter of the target;

said first means are located below the target;

said second means are located above the target; and above the target the resultant magnetic field normal to the target has a point of zero field strength.

2. The cathode arc source of claim 1, further comprising: a vacuum chamber.

3. The cathode arc source of claim 2 wherein:

(1) at a front surface of the target, field strength in a lateral direction is at least 5 Gauss and field direction normal to the front surface is towards the front surface;

(2) magnetic field strength normal to the front surface decreases with increasing distance from the target to a point of zero field strength normal to the front surface; and (3) from the point of zero normal field strength, with increasing distance from the target, field direction is away from the front surface of the target.

4. The cathode arc source of claim 3 wherein said first means for generating a first magnetic field are proximal to the target and have a first field direction and said second means for generating a second magnetic field are distal from the target and have a field direction opposite to that of the first field direction.

5. The cathode arc source of claim 4 further comprising a cathode centrally located within said vacuum chamber and an anode of larger diameter than the cathode that surrounds the cathode and wherein the cathode is electrically insulated from the anode by a non-conducting shroud.

6. The cathode arc source of claim 5 in which at the point of zero normal field strength there is a lateral magnetic field having a strength of between 12 and 35 Gauss.

7. The cathode arc source of claim 6 wherein the point of zero normal magnetic field is located between 3 and 7 cm above the surface of the target.

8. The cathode arc source of claim 7, comprising a liner composed of two or more pieces that interlock to form a liner that fits inside the source and against an outer surface of the anode and which pieces can be separated for removal from the source.

9. The cathode arc source of claim 9 in which pieces forming the liner are substantially symmetrical with each other.

10. The cathode arc source of claim 9 wherein pieces of the liner connect with each other by interference fit of respective projections and recesses.

11. The cathode arc source of claim 10 wherein the liner is made of or comprises graphite.

12. The cathode arc source of claim 10 wherein the liner is made of or comprises stainless steel, molybdenum or nickel.

13. A method of depositing non-graphite ions on a substrate using a cathode arc source comprising:

(1) forming an arc between a non-graphite target and an anode of the source using arc current sufficient to sustain the arc;

(2) providing a magnetic field which is the resultant of first and second magnetic fields of opposite direction and has a region of zero normal field strength above the whole of the target; and (3) varying the position of zero field strength whilst sustaining the arc.

14. The method of claim 13 further comprising providing a steering field above the target and a reversing field at or below the target and varying strength or position of either the steering field or the reversing field or both.

15. A method of depositing non-graphite ions on a substrate using a cathode arc source comprising:

(1) forming an arc between a non-graphite target and an anode of the source using arc current sufficient to sustain the arc;

(2) providing a magnetic field which is the resultant of first and second magnetic fields of opposite direction and has a position of zero normal field strength above the target; and (3) varying the position of zero field strength whilst sustaining the arc;

wherein said varying comprises periodically oscillating the position of zero field strength so as periodically to oscillate the position on a wall of the anode of the cathode arc source at which greatest wear or contamination occurs.

16. An apparatus for depositing ions on a substrate comprising:

a cathode arc source having a cathode and an anode first magnetic field generating means for generating a magnetic field between a target and a substrate for steering plasma generated by the cathode arc source onto the substrate, and second magnetic field generating means for generating a magnetic field at or around the target, whereby strength of the first magnetic field can be varied, or strength or position of the second magnetic field can be varied; and said apparatus further comprising a liner composed of two or more pieces that interlock to form a liner that fits inside the source and against an outer surface of the anode and which pieces can be separated for removal from the source.

17. The apparatus of claim 16, wherein at the surface of the target there is a lateral field of at least 5 Gauss.

* * * * *